(12) United States Patent
Chuang

(10) Patent No.: US 6,690,219 B2
(45) Date of Patent: Feb. 10, 2004

(54) DIGITAL WAVE GENERATING APPARATUS AND THE METHOD THEREOF

(75) Inventor: Ying-Lang Chuang, Kaohsiung (TW)

(73) Assignee: Via Technologies, Inc., Taipei (TW)

( * ) Notice: Subject to any disclaimer, the term of this patent is extended or adjusted under 35 U.S.C. 154(b) by 0 days.

(21) Appl. No.: 10/214,708

(22) Filed: Aug. 9, 2002

(65) Prior Publication Data

US 2003/0042954 A1 Mar. 6, 2003

(30) Foreign Application Priority Data

Sep. 6, 2001 (TW) .......................................... 90122164

(51) Int. Cl.[7] ................................................ H03K 3/017
(52) U.S. Cl. ........................................ 327/176; 327/407
(58) Field of Search .................................. 327/170, 172, 327/176, 291, 294, 298, 99, 407, 107

(56) References Cited

U.S. PATENT DOCUMENTS

| | | | | |
|---|---|---|---|---|
| 5,652,536 A | * | 7/1997 | Nookala et al. | 327/298 |
| 5,726,593 A | * | 3/1998 | Ruuskanen | 327/99 |
| 5,877,636 A | * | 3/1999 | Truong et al. | 327/99 |
| 6,429,698 B1 | * | 8/2002 | Young | 327/99 |

* cited by examiner

Primary Examiner—My-Trang Nu Ton
(74) Attorney, Agent, or Firm—Rabin & Berdo, P.C.

(57) ABSTRACT

A generating a digital wave apparatus is provided. The period of a basic clock signal is divided into a plurality of time points, and the level of the highly accurate digital wave is toggled at these time points. The apparatus comprises a delay phase lock loop, for generating a plurality of delayed clock signals according to the basic clock signal; a first multiplexer and a second multiplexer for outputting one of the delayed clock signals according to a first select signal and a second select signal, respectively; a first edge-triggered flip-flop and a second edge-triggered flip-flop for receiving the output signals of the first multiplexer and the second multiplexer respectively; and a logic gate for outputting the digital wave according to the outputs of the first and the second edge-triggered flip-flops. The digital wave is toggled according to the first select signal, and further toggled according to the second select signal. The apparatus of the invention uses the low frequency clock signal to generate a highly accurate digital wave, and can save cost in comparison with the conventional apparatus that uses the high frequency clock signal.

32 Claims, 3 Drawing Sheets

DIGITAL WAVE GENERATING APPARATUS AND THE METHOD THEREOF

CROSS REFERENCE TO RELATED APPLICATION

This application claims the priority benefit of Taiwan application Ser. No. 090122164, filed Sep. 6, 2001.

BACKGROUND OF THE INVENTION

1. Field of the Invention

This invention relates in general to an apparatus for generating a digital wave and the method thereof. More specifically, this invention relates to an apparatus for generating a digital wave and the method thereof, in which a low frequency clock is used for generating a highly accurate digital wave.

2. Description of Related Art

As the demand for high-capacity storage increases, so does the use of the optical information recording apparatus, such as a rewritable or recordable optical drive. When a writable optical drive writes data to a compact disc rewritable (CD-RW), a laser diode emits the energy required for the data recording. During the entire writing process, the laser diode has to be capable of providing three optical signals of different powers. When the optical signal of a different power illuminates the optical disc, the data area on the optical disc will create a corresponding status due to the different power.

FIG. 1 is a diagram showing the variation of the power of the optical signal for recording corresponding to a data area of the optical disc. The data area of a rewritable optical disc has a space area and a mark area. The data stored in the mark area is constituted by logic "1" and logic "0". When the laser beam passes the space area, an optical signal having an erase power $P_{ERASE}$ generated by the laser diode must be used to illuminate the optical disc. When the laser beam passes the mark area, an optical signal, alternatively having a write power $P_{WRITE}$ and a bias power $P_{BIAS}$ generated by the laser diode must be used to illuminate the optical disc.

When writing to the mark area, the required times of the optical signal having the write power $P_{WRITE}$ and the bias power $P_{BIAS}$ are determined by the characteristic of the optical disc and the specification of the data to be written. One writing period comprises at least one writing power $P_{WRITE}$ and at least one bias power $P_{BIAS}$. Therefore, in one writing period T, the writing power $P_{WRITE}$ and the bias power $P_{BIAS}$ are generated according to a highly accurate digital wave W. In general, the digital wave W has to be toggled once or twice within one writing period.

FIG. 2 is an example of a highly accurate digital wave. If a writing period T is divided into n time points, the digital wave W needs to be toggled once or twice within the writing period T. The time point for the toggle state is selected from the n time points. Referring to FIG. 2, the time points for the toggle state are time point 4 and time point 12, FIG. 3 is a block diagram of a conventional apparatus for generating a digital wave. Referring to FIG. 3, the digital wave generating apparatus 300 comprises a counter 310, comparators C1, C2, a multiplexer 312 and flip-flop 314. The counter 310 is used for receiving a high frequency clock signal CLKn. When the high frequency clock signal CLKn finishes one periodic cycle, the counting value C to be outputted from the counter 310 is added by 1. The period of the high frequency clock signal CLKn is one-nth of the writing period T. The comparator C1 is coupled to the counter 310 for receiving the counting value C and the select signal S1 and outputting a comparison signal P1. The comparator C2 is coupled to the counter 310 for receiving the counting value C and the select signal S2 and outputting a comparison signal P2.

The select signal S1 is used for determining the time point at which the digital wave W is toggled from the low level to the high level. The select signal S2 is used for determining the time point that the digital wave W is toggled from the high level to the low level. The multiplexer 312 is coupled to the comparators C1 and C2 for receiving the comparison signals P1 and P2, and then outputting the multiplexing signal m. When the digital wave W is at the low level, the multiplexer 312 outputs the comparison signal P1. When the digital wave W is at the high level, the multiplexer 312 outputs the comparison signal P2. The flip-flop 314 is coupled to the multiplexer 312 for receiving the multiplexing signal m and outputting the digital wave W. When the multiplexing signal m is toggled from the low level to the high level, the digital wave W to be outputted from the flip-flop 314 is also toggled.

Accordingly, the conventional apparatus for generating the highly accurate digital wave requires a high frequency clock signal, having the disadvantages of high cost and being difficult to control the accuracy.

SUMMARY OF THE INVENTION

According to the foregoing description, an object of this invention is to provide an apparatus for generating a highly accurate digital wave by using a low frequency clock signal and the method thereof.

Therefore, the invention is to provide an apparatus for generating a digital wave. A period of a basic clock signal is divided into a plurality of time points, and the level of the highly accurate digital wave is toggled at these time points. The apparatus comprises a delay phase lock loop, for generating a plurality of delayed clock signals according to the basic clock signal. The apparatus further comprises a first multiplexer and a second multiplexer, each for outputting one of the delayed clock signals according to the first and the second select signals, respectively. The apparatus further comprises the first and the second edge-triggered flip-flops, for receiving output signals of the first and the second multiplexer respectively. The apparatus further comprises a logic gate for outputting the digital wave according to the outputs of the first and the second edge-toggled flip-flops. The digital wave is toggled according to the first select signal, and then further toggled according to the second select signal.

BRIEF DESCRIPTION OF THE DRAWINGS

While the specification concludes with claims particularly pointing out the subject matter which is regarded as the invention, the objects and features of the invention and further objects, features and advantages thereof will be better understood from the following description taken in connection with the accompanying drawings in which:

DESCRIPTION OF THE PREFERRED EMBODIMENT

Figure 1:
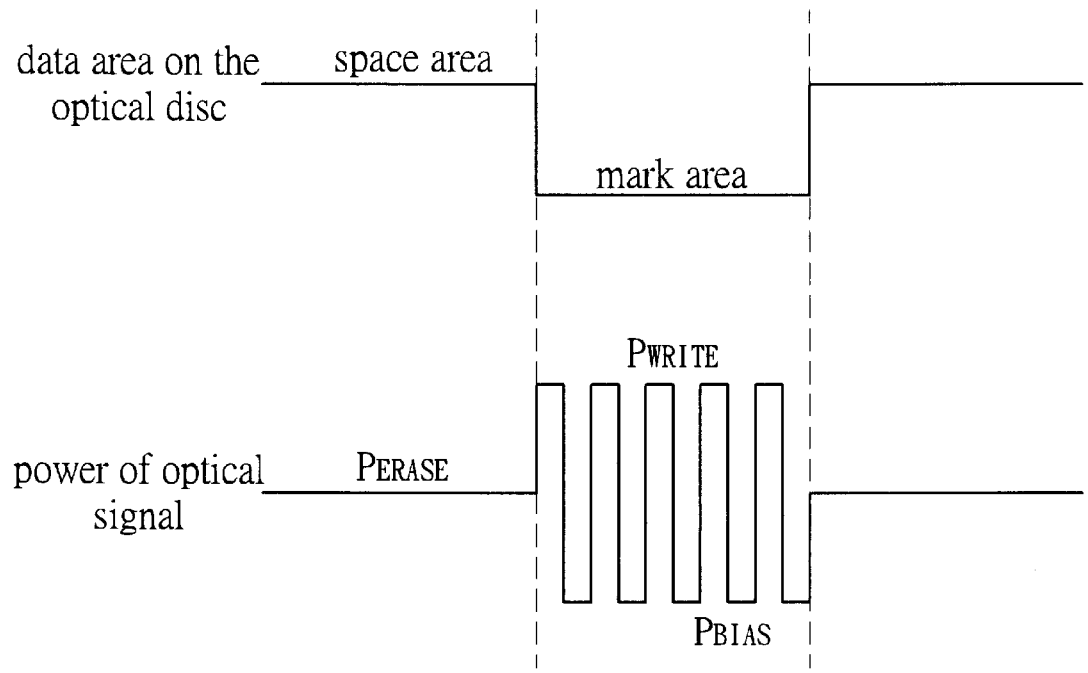
FIG. 1 is a diagram showing the variation of the power of the optical signal for recording corresponding to a data area of the optical disc.
Figure 2:
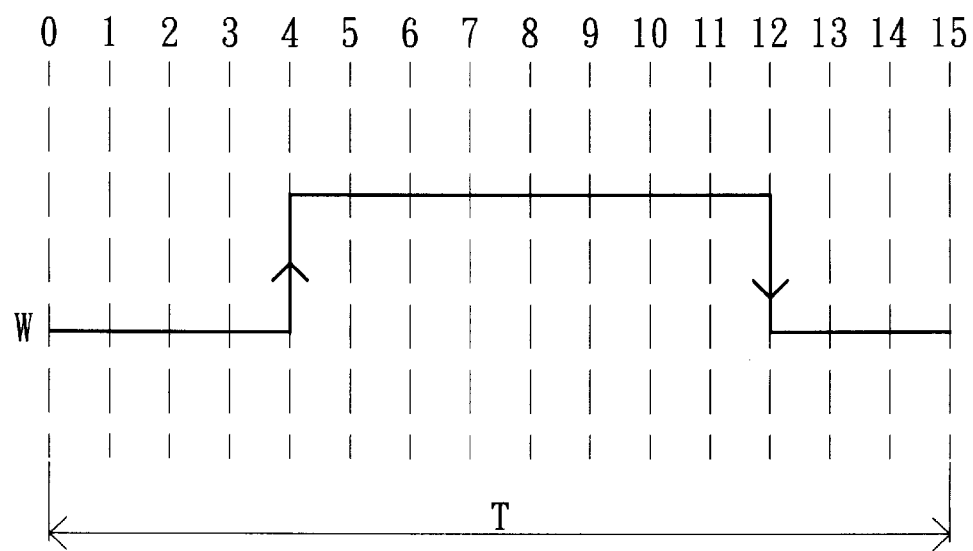
FIG. 2 is an example of a highly accurate digital wave.
Figure 3:
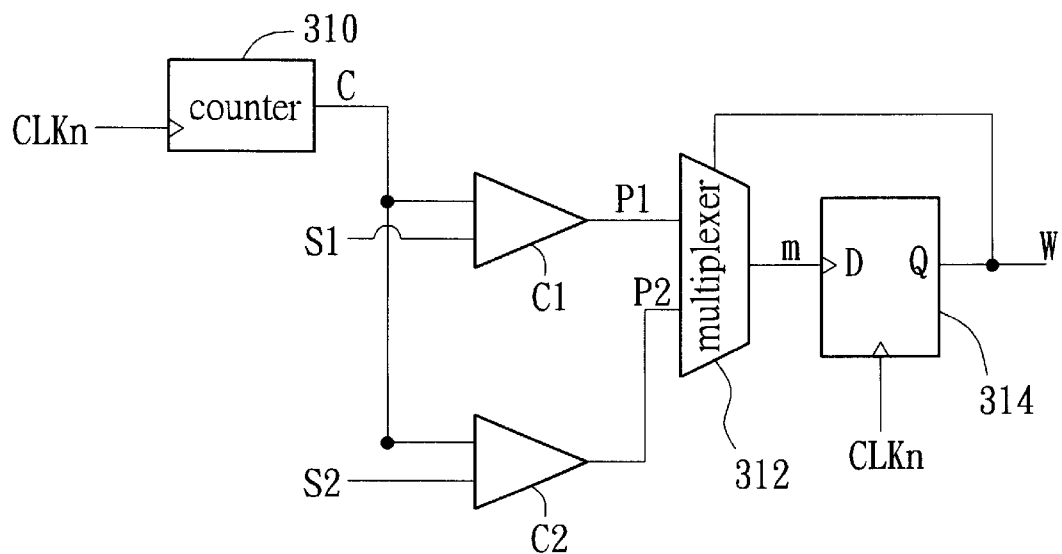
FIG. 3 is a block diagram of a conventional apparatus for generating a digital wave.
Figure 4:
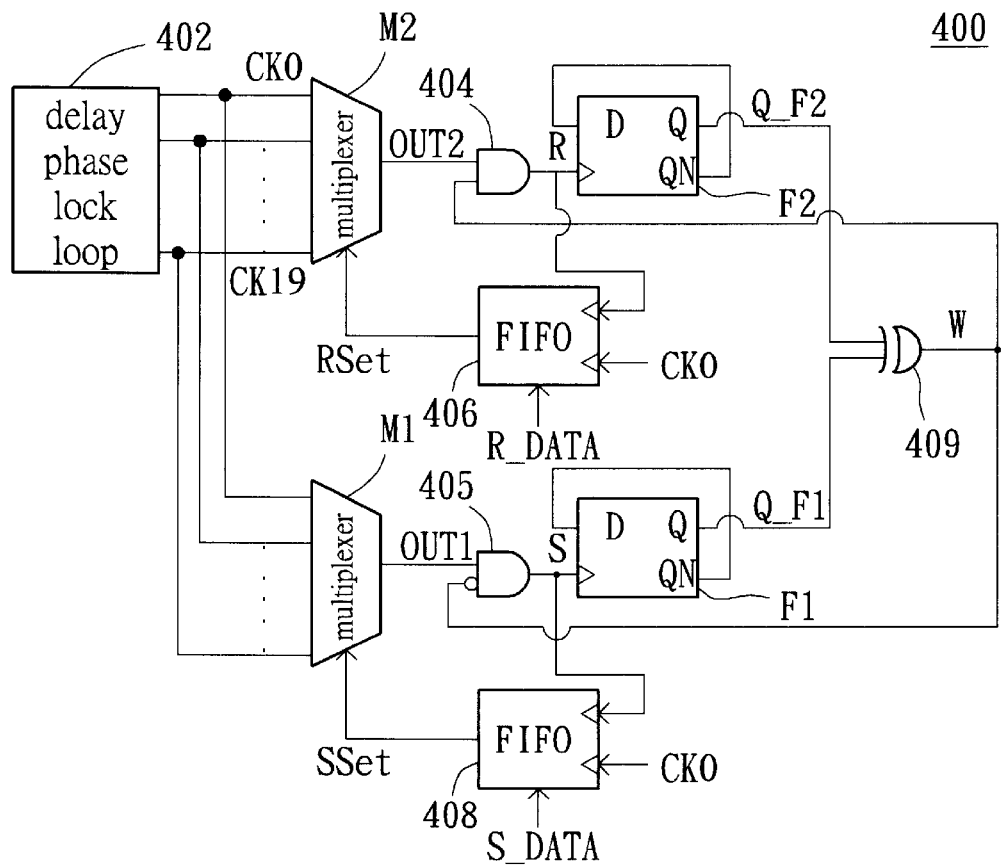
FIG. 4 is a block diagram of an apparatus for generating a digital wave according to one preferred embodiment of the invention.

Referring to FIG. 4, it is a block diagram of an apparatus for generating a digital wave according to one preferred embodiment of the invention. The apparatus 400 for generating a digital wave is used for generating a highly accurate digital wave W. A basic period of a basic wave can be divided into n time points, and the level of the digital wave W is toggled at these time points, in which n is an integral and has a value 20 as an example in this embodiment. The apparatus 400 for generating a digital wave comprises a delay phase lock loop (DLL) 402, multiplexers M1 and M2, logic gates 404 and 405, FIFOs 406 and 408, edge-triggered flip-flops F1 and F2, and a logic gate 409 (such as an XOR gate). The DLL 402 is used for generating n clock signals CK0~CKn−1 according to a basic clock signal CK0. The phase difference between adjacent clock signals is 2×π/n (or the basic period/n), i.e., the phase difference between the clock signal CKm and the clock signal CKm+1 is 2×π/n, in which m is an integral small than n. The multiplexer M1 is coupled to the DLL 402 for receiving the clock signals CK0~CKn−1, and then selects one of these clock signals CK0~CKn−1 as an output signal OUT1 according to a select signal SSet. The select signal SSet is used for determining a time point at which the digital wave W is toggled from a low level to a high level. According to FIG. 4, the logic gate 405 is composed of an inverter and an AND gate, which is understood to those skilled in the art and their descriptions are omitted. The logic gate 405 receives the output signal OUT1 and the digital wave W that is feedback to the logic gate 405, to generate a first triggering signal S. The edge-triggered flip-flop F1 is triggered by the first triggering signal S, and outputs an output signal Q_F1 at the terminal Q to the logic gate 409 (such as the XOR gate), wherein the input terminal D of the flip-flop F1 is connected to its output terminal QN.

Similarly, the multiplexer M2 is coupled to the DLL 402 for receiving the clock signals CK0~CKn−1, and selects one of these clock signals CK0~CKn−1 as an output signal OUT2 according to a select signal RSet, in which the select signal is used for determining a time point that the digital wave W is toggled from a high level to a low level. The logic gate 404 receives the output signal OUT2 and the digital wave W that is fed back to the logic gate 404, to generate a second triggering signal R. The edge-triggered flip-flop F2 is triggered by the second triggering signal R, and outputs an output signal Q_F2 at the terminal Q to the logic gate 409 (such as the XOR gate), wherein the input terminal D of the flip-flop F2 is connected to its output terminal QN.

According to the invention, trigger points at the rising edge and the falling edge of the digital wave W can be set. Referring to FIG. 4, the FIFO 408 and the FIFO 406 receive the S_DATA (for setting the trigger point at the rising edge of the digital wave W) and the R_DATA (for setting the trigger point at the falling edge of the digital wave W) respectively. The FIFO 408 further receives the clock signal CK0 and the first triggering signal S output from the logic gate 405. The clock signal CK0 is used for triggering the FIFI 408 to receive the S_DATA, and the first triggering signal S is used for triggering the FIFO 408 to output the select signal SSet to the multiplexer M1. For example, if the digital wave W is required to be triggered at the rising edge at CK1 and CK3 respectively, the S_DATA is 1 and 3 respectively, wherein 1 and 3 represent the clock signals CK1 and CK3. Similarly, the FIFO 406 further receives the clock signal CK0 and the second triggering signal R output from the logic gate 404. The clock signal CK0 is used for triggering the FIFI 406 to receive the R_DATA, and the second triggering signal R is used for triggering the FIFO 406 to output the select signal RSet to the multiplexer M2. For example, if the digital wave W is required to be triggered at the falling edge at CK5 and CK19 respectively, the R_DATA is 5 and 19 respectively, wherein 5 and 19 represent the clock signals CK5 and CK19.

Figure 5:
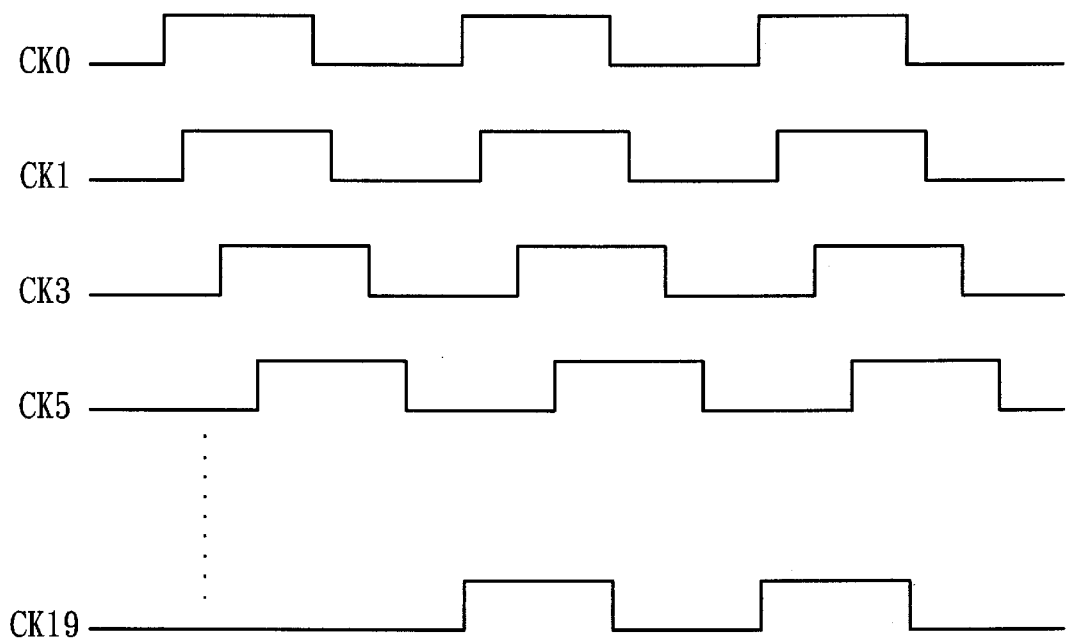
FIG. 5 is a timing diagram for the apparatus for generating a digital wave in FIG. 4.
Figure 5:
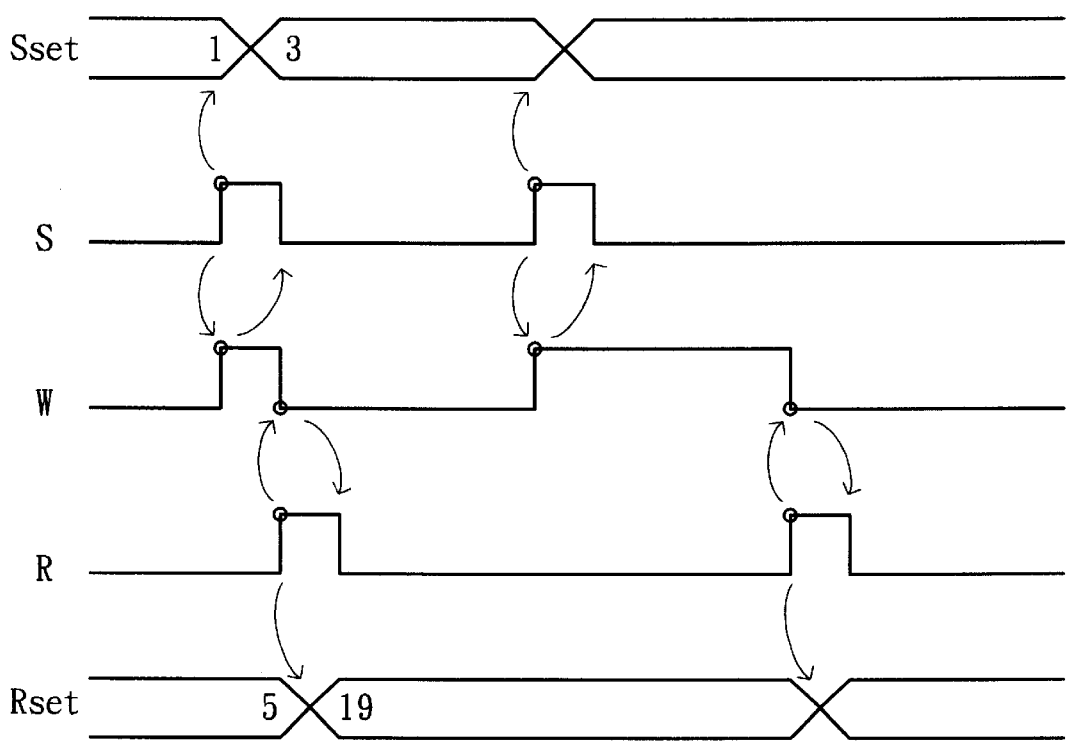

Next, the following describes how the digital wave W is generated. Referring to FIG. 5, it is a timing diagram for the apparatus 400 for generating a digital wave in FIG. 4. The phase difference between adjacent two of the clock signals CK0~CKn−1 output from the DLL 402 is 2×π/n. In the following description, in certain one period, the digital wave W needs to be toggled to a high level at time point 1 and toggled to a low level at time point 5. In the next period, the digital wave W needs to be toggled to a high level at time point 3 and toggled to a low level at time point 19.

First, when no clock signals are outputted from the multiplexers M1 and M2, the signals S and R are low levels, so that the digital wave W is a low level. When the multiplexer M1 outputs the clock signal CK1 according to the select signal SSet and after being processed by the logic gate 405, the first triggering signal S becomes a high level. According to the invention, in order to prevent the accuracy of the digital wave W from being affected, the FIFO 408 will transmit the next select signal SSet to the multiplexer M1 after the first triggering signal S becomes the high level. The high level of the signal S makes the output Q_F1 of the edge triggered flip-flop F1 change to the high level. Next, the digital wave W will be toggled from the low level to the high level because the output Q_F1 is toggled. The high level of the digital wave W is then feedback to the logic gate 405 so that the first triggering signal S is toggled to the low level again.

Similarly, when the multiplexer M2 outputs the clock signal CK5 according to the select signal RSet and after being processed by the logic gate 404, the second triggering signal R becomes a high level. According to the invention, in order to prevent the accuracy of the digital wave W from being affected, the FIFO 406 will transmit the next select signal RSet to the multiplexer M2 after the second triggering signal R becomes the high level. The high level of the signal R makes the output Q_F2 of the edge triggered flip-flop F2 toggled to the high level. Next, the digital wave W will be toggled from the high level to the low level because the output Q_F2 is toggled. The low level of the digital wave W is then feedback to the logic gate 404 so that the second triggering signal R is toggled to the low level again.

Similarly, the next cycle is proceeded in the same way so that the digital wave W can be toggled to a high level at time point 3, and toggled to a low level at time point 19.

The aforementioned embodiment is the best embodiment according to the invention, but the embodiment without the FIFO 406, 408, logic gate 404 and 405 can also generate the digital wave W. The edge-triggered flip-flop F1 receives a delayed clock signal, which determines the rising time of the digital wave. At the rising time, the edge-triggered flip-flop F1 is triggered to change the state of the digital wave W. The edge-triggered flip-flop F2 receives another delayed clock signal, which determines the falling time of the digital wave W. At the falling time, the edge-triggered flip-flop F2 is triggered to change the state of the digital wave W.

The logic gate 405, edge-triggered flip-flop F1 and the FIFO 408 can be considered as a first processing apparatus;

the logic gate 404, edge-triggered flip-flop F2 and FIFO 406 can be considered as a second processing apparatus. The first processing apparatus and the second apparatus output Q_F1 and Q_F2 respectively for outputting the digital wave W via the logic gate 409.

In the above embodiment, other devices can be used for replacing the DLL 402, such as a voltage controlled oscillator (VCO). Additionally, if the digital wave W requires to be triggered more than twice within one period of the basic clock signal CK0, the frequency of the basic clock signal CK0 can be properly divided and the phase of the frequency-divided basic clock signal CK0 is then delayed on demand.

According to the invention, the apparatus for generating the digital wave uses the low frequency clock signal to generate a highly accurate digital wave, so that the cost can be saved in comparison with the conventional apparatus that uses the high frequency clock signal.

While the present invention has been described with a preferred embodiment, this description is not intended to limit our invention. Various modifications of the embodiment will be apparent to those skilled in the art. Therefore the appended claims should be accorded the broadest interpretation so as to cover any such modifications or embodiments within the scope of the invention.

What is claimed is:

1. A digital wave generating apparatus, wherein a period of a basic clock signal is divided into a plurality of time points, and the digital wave is triggered at the time points, the apparatus comprising:
   a delay phase lock loop, for generating a plurality of delayed clock signals according to the basic clock signal;
   a first multiplexer, coupled to the delay phase lock loop, for outputting a first output signal, which is one of the delayed clock signals, according to a first select signal;
   a second multiplexer, coupled to the delay phase lock loop, for outputting a second output signal, which is one of the delayed clock signals, according to a second select signal;
   a first edge-triggered flip-flop, for receiving the first output signal of the first multiplexer;
   a second edge-triggered flip-flop, for receiving the second output signal of the second multiplexer; and
   a first logic gate, for outputting the digital wave according to the outputs of the first and the second edge-triggered flip-flops.

2. The apparatus of claim 1, wherein level of the digital wave is toggled from a first level to a second level at a time point (j), and toggled from the second level to the first level at a time point (k), the output signal of the first multiplexer is the clock signal (j), and the output signal of the second multiplexer is the clock signal (k), $0<j<k\leq n$, and j, k are positive integrals.

3. The apparatus of claim 2, wherein first level is a low level and the second level is a high level.

4. The apparatus of claim 1, wherein the first and the second edge-triggered multiplexers are triggered at a rising edge.

5. The apparatus of claim 1, wherein the first logic gate is an XOR gate.

6. The apparatus of claim 1, further comprising a second logic gate for receiving the digital wave and the output signal of the first multiplexer, to generate a first triggering signal to control the first edge-triggered flip-flop.

7. The apparatus of claim 6, further comprising a first storage device for receiving a first data signal according to the basic clock signal, and outputting the first select signal to the first multiplexer according to the first triggering signal.

8. The apparatus of claim 6, wherein the second logic gate comprises and inverter and an AND gate, wherein the digital wave is first input to the inverter and then to the AND gate.

9. The apparatus of claim 1, further comprising a third logic gate for receiving the digital wave and the output signal of the second multiplexer, to generate a second triggering signal to control the second edge-triggered flip-flop.

10. The apparatus of claim 9, further comprising a second storage device for receiving a second data signal according to the basic clock signal, and outputting the second select signal to the second multiplexer according to the second triggering signal.

11. The apparatus of claim 10, wherein the third logic gate comprises an AND gate.

12. A digital wave generating apparatus, wherein a period of a basic clock signal is divided into a plurality of dine points, and the digital wave is triggered at the time points, the apparatus comprising:
   a delay phase lock loop, for generating a plurality of delayed clock signals according tote basic clock signal;
   a first multiplexer, coupled to the delay phase lock loop, for outputting a first output signal, which is one of the delayed clock signals, according to a first select signal;
   a second multiplexer, coupled to the delay phase lock loop, for outputting a second output signal, which is one of the delayed clock signals, according to a second select signal;
   a first edge-triggered flip-flop, for receiving the first output signal of the first multiplexer;
   a second edge-triggered flip-flop, for receiving the second output signal of the second multiplexer;
   a first logic gate, for outputting the digital wave according to the outputs of the first and the second edge-triggered flip-flops;
   a second logic gate, for receiving the digital wave and the output signal of the first multiplexer, to generate a first triggering signal to control the first edge-triggered flip-flop;
   a first storage device for receiving a first data signal according to the basic clock signal, and outputting the first select signal to the first multiplexer according to the first triggering signal;
   a third logic gate, for receiving the digital wave and the output signal of the second multiplexer, to generate a second triggering signal to control the second edge-triggered flip-flop; and
   a second storage device for receiving a second data signal according to the basic clock signal, and outputting the second select signal to the second multiplexer according to the second triggering signal.

13. The apparatus of claim 12, wherein level of the digital wave is toggled from a first level to a second level at a time point (j), and toggled from the second level to the first level at a time point (k), the output signal of the first multiplexer is the clock signal (j), and the output signal of the second multiplexer is the clock signal (k), $0<j<k\leq n$, and j, k are positive integrals.

14. The apparatus of claim 13, wherein first level is a low level and the second level is a high level.

15. The apparatus of claim 12, wherein the first and the second edge-triggered multiplexers are triggered at a rising edge.

16. The apparatus of claim 12, wherein the first logic gate is an XOR gate.

17. The apparatus of claim 12, wherein the third logic gate is an AND gate.

18. The apparatus of claim 12, wherein the second logic gate comprises an inverter and an AND gate, the digital wave received by the second logic gate is first input to the inverter and then to the AND gate of the second logic gate.

19. A digital wave generating apparatus, wherein a period of a basic clock signal is divided into a plurality of time points, and the digital wave is triggered at the time points, the apparatus comprising:
   a first processing apparatus for generating a first process output signal in response to the digital wave inverted, a plurality of clock signals, and a first data signal;
   a second processing apparatus for generating a second process output signal in response to the digital wave, the plurality of clock signals, and a second data signal; and
   an output control gate for generating the digital wave in response to the first process output signal and the second process output signal.

20. The apparatus of claim 19, wherein the first processing apparatus comprises:
   a first logic gate for generating a first triggering signal in response to the digital wave inverted and the clock signals; and
   a first edge-triggered flip-flop for generating the first process output signal in response to the first triggering signal.

21. The apparatus of claim 20, wherein the first processing apparatus further comprises a first storage device for generating a first select signal in response to the basic clock signal, the first triggering signal and the first data signal, wherein the first select signal is used to control the inputting of the clock signals into the first process apparatus.

22. The apparatus of claim 21, further comprising a first multiplexer for selecting one of the clock signals to be input to the first process apparatus according to the first select signal.

23. The apparatus of claim 19, wherein the second process apparatus comprises:
   a second logic gate for generating a second triggering signal in response to the digital wave inverted and the clock signals; and
   a second edge-triggered flip-flop for generating the second process output signal in response to the second triggering signal.

24. The apparatus of claim 23, wherein the second process apparatus further comprise a second storage device for generating a second select signal in response to the basic clock signal, the second triggering signal and the second data signal, wherein the second select signal is used to control the inputting of the clock signals into the second process apparatus.

25. The apparatus of claim 24, further comprising a second multiplexer for selecting one of the clock signals to input to the second process apparatus according to the second select signal.

26. The apparatus of claim 19, wherein the clock signals are generated by a delayed phase took loop delaying the basic clock signal, wherein each of the clock signals are a delayed basic clock signal, and the delayed times of die clock signals are different.

27. The apparatus of claim 19, wherein the output control gate comprises an XOR gate.

28. The apparatus of claim 19, wherein the first process apparatus controls the rising of the digital wave according to the first data signal, and the second process apparatus controls the falling of the digital wave according tote second data signal.

29. A digital wave generating method, wherein a period of a basic clock signal is divided into a plurality of time points, and the digital wave is triggered at the time points, the apparatus comprising:
   generating a plurality of delayed clock signals according to a basic clock signal, wherein the delay times of the delayed clock signals are different;
   select a first multiplexing signal from the delayed clock signals according to a first select signal;
   select a second multiplexing signal from the delayed clock signals according to a second select signal;
   receiving the first multiplexing signal and accordingly outputting a first triggering signal;
   receiving the second multiplexing signal and accordingly outputting a second triggering signal; and
   generating the digital wave according to the first triggering signal and the second triggering signal;
   wherein, the digital wave is low initially, the digital wave is high when the first triggering signal is enabled, and then the digital wave is low when the second triggering signal is enabled.

30. A digital wave generating method, wherein a period of a basic clock signal is divided into a plurality of time points, and digital wave is triggered at the time points, the apparatus comprising:
   generating a first process output signal in response to the digital wave inverted a plurality of clock signals and a first data signal, wherein the first data signal is used for indicating the rising time point of the digital wave;
   generating a second process output signal in response to the digital wave, the plurality of clock signals and a second data signal, wherein the second data signal is used for indicating the falling time point of the digital wave; and
   generating the digital wave according to the first process output signal and the second process output signal.

31. The method of claim 30, wherein the plurality of clock signals are generated by delaying the basic clock signal, wherein the delayed times of the clock signals are different.

32. The method of claim 30, wherein the digital wave is generated by executing an XOR operation of the first process output signal and the second process output signal.

* * * * *

UNITED STATES PATENT AND TRADEMARK OFFICE
CERTIFICATE OF CORRECTION

| | |
|---|---|
| PATENT NO. | : 6,690,219 B2 |
| APPLICATION NO. | : 10/214708 |
| DATED | : February 10, 2004 |
| INVENTOR(S) | : Ying-Lang Chuang |

It is certified that error appears in the above-identified patent and that said Letters Patent is hereby corrected as shown below:

Title Page, Item 56 (References Cited)

Please add the following to the list of References Cited under U.S. Patent Documents:

-- 6,130,566   10/2000   Yokomizo..............327/175
   5,568,075   10/1996   Curran et al..........327/172 --

Signed and Sealed this

Fifteenth Day of January, 2008

JON W. DUDAS
*Director of the United States Patent and Trademark Office*